United States Patent
Noda

(10) Patent No.: US 8,841,165 B2
(45) Date of Patent: Sep. 23, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/010,574

(22) Filed: Aug. 27, 2013

(65) Prior Publication Data

US 2013/0344650 A1     Dec. 26, 2013

Related U.S. Application Data

(62) Division of application No. 13/410,604, filed on Mar. 2, 2012, now Pat. No. 8,541,781.

(30) Foreign Application Priority Data

Mar. 10, 2011 (JP) ................................ 2011-052905

(51) Int. Cl.
*H01L 21/00* (2006.01)
*H01L 27/115* (2006.01)
*H01L 29/66* (2006.01)
*H01L 27/12* (2006.01)
*H01L 29/786* (2006.01)

(52) U.S. Cl.
CPC ...... *H01L 29/66742* (2013.01); *H01L 27/1156* (2013.01); *H01L 27/1207* (2013.01); *H01L 29/78696* (2013.01); *H01L 29/7869* (2013.01); *H01L 29/78618* (2013.01)
USPC ........................................... 438/104; 257/43

(58) Field of Classification Search
CPC ............ H01L 29/66969; H01L 21/024; H01L 21/02403; H01L 21/02414; H01L 27/1225; H01L 27/1288; H01L 2021/775
USPC ........................................... 438/104; 257/43
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1 737 044 A    12/2006
EP    2 226 847 A    9/2010
(Continued)

OTHER PUBLICATIONS

Park et al., "High performance amorphous oxide thin film transistors with self-aligned top-gate structure," IEDM 09: Technical Digest of International Electron Devices Meeting, Dec. 7, 2009, pp. 191-194.

(Continued)

*Primary Examiner* — Fernando L Toledo
*Assistant Examiner* — Christine C Lau
(74) *Attorney, Agent, or Firm* — Eric J. Robinson; Robinson Intellectual Property Law Office, P.C.

(57) ABSTRACT

A semiconductor device includes an oxide semiconductor film including a pair of first regions, a pair of second regions, and a third region; a pair of electrodes in contact with the oxide semiconductor film; a gate insulating film over the oxide semiconductor film; and a gate electrode provided between the pair of electrodes with the gate insulating film interposed therebetween. The pair of first regions overlap with the pair of electrodes, the third region overlaps with the gate electrode, and the pair of second regions are formed between the pair of first regions and the third region. The pair of second regions and the third region each contain nitrogen, phosphorus, or arsenic. The pair of second regions have a higher element concentration than the third region.

16 Claims, 10 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,164,090 B2 | 4/2012 | Iwasaki et al. |
| 8,643,007 B2 * | 2/2014 | Nomura et al. ................. 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 * | 11/2006 | Sugihara et al. ............. 257/646 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0050884 A1 | 2/2009 | Ye |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0084655 A1 * | 4/2010 | Iwasaki et al. .................. 257/43 |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0136743 A1 | 6/2010 | Akimoto et al. |
| 2010/0181565 A1 | 7/2010 | Sakata et al. |
| 2011/0095354 A1 | 4/2011 | Takano et al. |
| 2011/0101333 A1 | 5/2011 | Shionoiri et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0147738 A1 * | 6/2011 | Yamazaki et al. .............. 257/43 |
| 2011/0163311 A1 | 7/2011 | Akimoto et al. |
| 2011/0175090 A1 | 7/2011 | Sugihara et al. |
| 2011/0204362 A1 * | 8/2011 | Akimoto et al. ................. 257/52 |
| 2012/0161121 A1 | 6/2012 | Yamazaki |
| 2012/0161122 A1 * | 6/2012 | Yamazaki ....................... 257/43 |
| 2012/0161124 A1 | 6/2012 | Yamazaki |
| 2012/0161126 A1 * | 6/2012 | Yamazaki ....................... 257/43 |
| 2012/0175609 A1 * | 7/2012 | Yamazaki ....................... 257/43 |
| 2012/0187396 A1 * | 7/2012 | Yamazaki et al. .............. 257/43 |
| 2012/0228606 A1 | 9/2012 | Koezuka et al. |
| 2012/0256177 A1 * | 10/2012 | Yamazaki ....................... 257/43 |
| 2012/0319102 A1 * | 12/2012 | Yamazaki et al. .............. 257/43 |
| 2013/0020659 A1 | 1/2013 | Yamazaki et al. |
| 2013/0240875 A1 * | 9/2013 | Endo et al. ...................... 257/43 |
| 2013/0256665 A1 * | 10/2013 | Takeuchi et al. ................ 257/57 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |

(56) References Cited

FOREIGN PATENT DOCUMENTS

| | | |
|---|---|---|
| JP | 2010-093070 A | 4/2010 |
| JP | 2010-135774 A | 6/2010 |
| WO | 2004/114391 | 12/2004 |

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m=3, 4, and 5), $InGaO_3(ZnO)_3$, and $Ga_2O_{3(ZnO)}m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)m$ (M=In,Ga; m=Integer) Described by Four-Dimensional Superspace Group,"Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16_{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

(56) References Cited

OTHER PUBLICATIONS

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Techinical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

\* cited by examiner

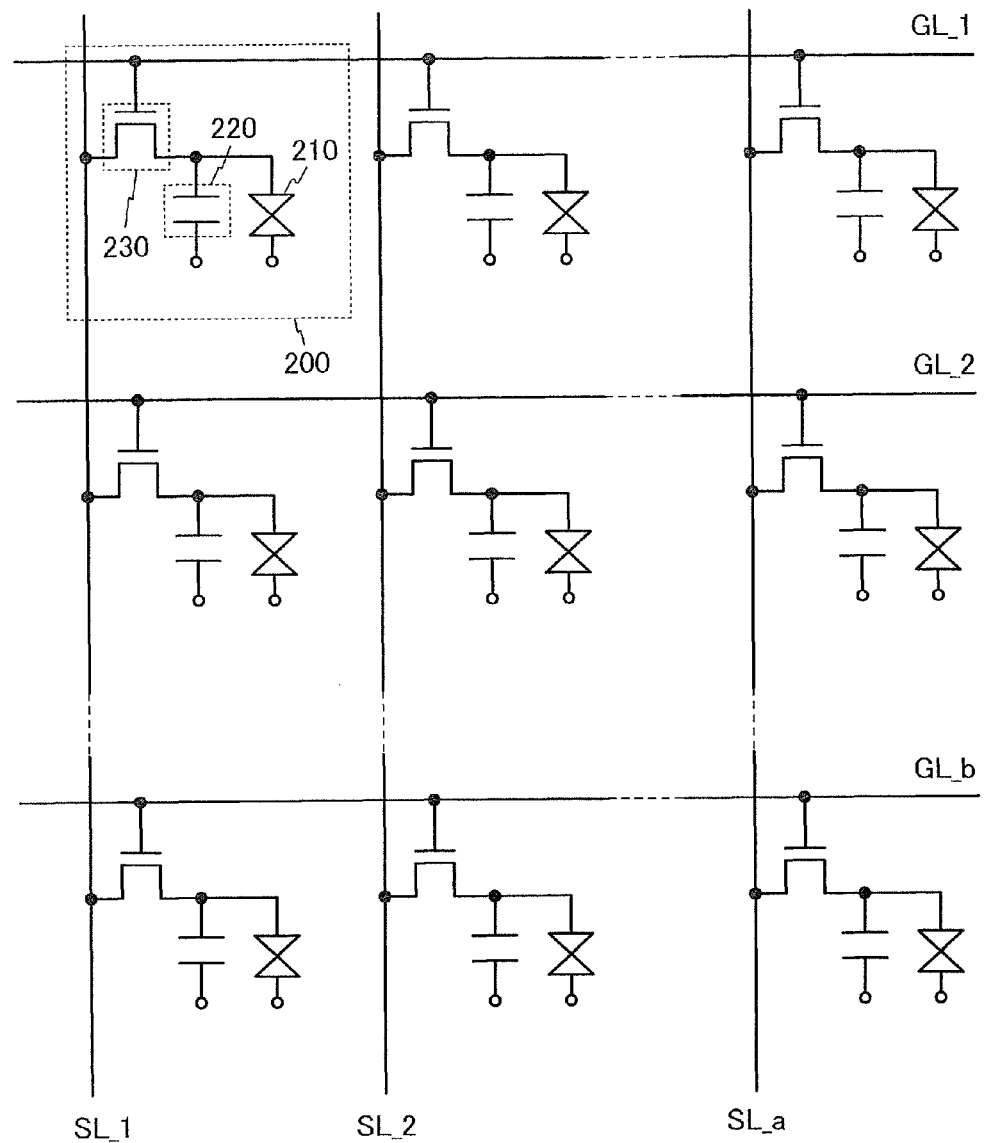

SEMICONDUCTOR DEVICE AND METHOD FOR MANUFACTURING THE SAME

BACKGROUND OF THE INVENTION

1. Field of the Invention

The present invention relates to a semiconductor device provided with a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device on which any of the above is mounted as a component.

In this specification, a semiconductor device means all types of devices which can function by utilizing semiconductor characteristics, and an electro-optical device, a light-emitting display device, a semiconductor circuit, and an electronic device are all semiconductor devices.

2. Description of the Related Art

Transistors formed over a glass substrate or the like are manufactured using amorphous silicon, polycrystalline silicon, or the like, as typically seen in liquid crystal display devices. Although transistors manufactured using amorphous silicon have low field-effect mobility, they can be formed over a larger glass substrate. On the other hand, although transistors manufactured using polycrystalline silicon have high field-effect mobility, they are not suitable for being formed over a larger glass substrate.

In contrast to transistors manufactured using silicon, attention has been drawn to a technique in which a transistor is manufactured using an oxide semiconductor, and such a transistor is applied to an electronic device or an optical device. For example, Patent Document 1 and Patent Document 2 disclose a technique in which a transistor is manufactured using zinc oxide or an In—Ga—Zn—O-based metal oxide as an oxide semiconductor, and such a transistor is used as a switching element of a pixel or the like of a display device.

Patent Document 3 discloses a technique in which in a staggered transistor including an oxide semiconductor, a highly conductive oxide semiconductor containing nitrogen is provided as buffer layers between a source region and a source electrode and between a drain region and a drain electrode, and thereby the contact resistance between the oxide semiconductor and the source electrode and between the oxide semiconductor and the drain electrode is reduced.

Non-Patent Document 1 discloses a top-gate oxide semiconductor transistor in which a channel region, a source region, and a drain region are formed in a self-aligned manner.

In the above-described manner, transistors including an oxide semiconductor have been developed. In an oxide semiconductor, however, oxygen deficiency serves as a donor and causes release of an electron which is a carrier. It is difficult to completely remove oxygen deficiency in an oxide semiconductor, resulting in difficulty in controlling the threshold voltage of a transistor including an oxide semiconductor.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-135774

Non-Patent Document

[Non-Patent Document 1] Jae Chul Park et al., "High performance amorphous oxide thin film transistors with self-aligned top-gate structure" IEDM2009, pp. 191-194

SUMMARY OF THE INVENTION

It is an object to provide a highly reliable semiconductor device by giving stable electric characteristics to a transistor of which an active layer is formed using an oxide semiconductor and the threshold voltage is difficult to control.

An embodiment of the present invention has the following technical idea: an active layer of a transistor is formed using an oxide semiconductor, and the electric resistance of a channel portion in the oxide semiconductor is increased by adding ions to the channel portion, thereby causing a shift of the threshold voltage of the transistor in the positive direction.

In general, part of oxygen deficiency in an oxide semiconductor film serves as a donor and causes release of an electron which is a carrier. Thus, the use of an oxide semiconductor film for an active layer of a transistor might cause a shift of the threshold voltage of the transistor in the negative direction owing to oxygen deficiency. In addition, when a large number of carriers are generated and the electric resistance of a channel portion gets too low, even switching of ON/OFF of the transistor becomes difficult to control. Therefore, it is necessary to form an oxide semiconductor film such that oxygen deficiency is not generated therein; however, it is difficult to control even release of a minute amount of oxygen in heat treatment which is performed after an oxide semiconductor film is formed or in exposure of an oxide semiconductor film to a reduced-pressure atmosphere. Note that even a minute amount of oxygen deficiency in an oxide semiconductor film causes a shift of the threshold voltage of a transistor in the negative direction; thus, the transistor tends to be normally on.

In view of the above, in accordance with an embodiment of the present invention, a transistor is manufactured in which even when a lot of oxygen deficiency exists and the electric resistance is low at the time of formation of an oxide semiconductor film, by addition of ions in a later step, the electric resistance of the oxide semiconductor film is controlled, which enables switching of ON/OFF of the transistor and a controlled threshold voltage of the transistor.

An embodiment of the present invention is a semiconductor device including: an oxide semiconductor film including a pair of first regions, a pair of second regions, and a third region; a pair of electrodes in contact with the oxide semiconductor film; a gate insulating film over the oxide semiconductor film; and a gate electrode provided between the pair of electrodes with the gate insulating film interposed therebetween. The pair of first regions overlap with the pair of electrodes, the third region overlaps with the gate electrode, and the pair of second regions are formed between o the pair of first regions and the third region. The pair of second regions and the third region each contain an element selected from nitrogen, phosphorus, and arsenic. The concentration of the element in the pair of second regions is higher than that in the third region.

Further, the concentration of the element in the pair of second regions may be higher than or equal to $5 \times 10^{21}$ atoms/ cm$^3$ and lower than 5×10$^{22}$ atoms/cm$^3$, and the concentration of the element in the third region may be higher than or equal to 5×10$^{20}$ atoms/cm$^3$ and lower than 5×10$^{21}$ atoms/cm$^3$.

In addition, the oxide semiconductor film can contain two or more elements selected from In, Ga, Sn, and Zn.

Since an embodiment of the present invention employs the transistor structure as described above, the pair of electrodes serving as a source electrode and a drain electrode do not overlap with the gate electrode. Therefore, parasitic capacitance can be reduced, and the transistor can operate at high speed.

Further, nitrogen, phosphorus, or arsenic is not added to regions which are in contact with the pair of electrodes serving a source electrode and a drain electrode in the oxide semiconductor film of the transistor. Thus, when the electric resistance is reduced in advance by generating oxygen deficiency in the oxide semiconductor film by, for example, controlling conditions for forming the oxide semiconductor film or heat treatment after the oxide semiconductor film is formed, contact resistance between the pair of electrodes and the oxide semiconductor film can be reduced. Accordingly, the on-state current of the transistor can be improved.

In addition, nitrogen, phosphorus, or arsenic can be added to both an oxide semiconductor film which is exposed and an oxide semiconductor film which is covered with an insulating film or the like.

The above addition of nitrogen, phosphorus, or arsenic may be performed by an ion doping method, an ion implantation method, or the like. A method other than an implantation method can also be used. For example, the above element can be added in the following manner: plasma treatment is performed on an object to which the element is to be added in an atmosphere of a gas containing the element to be added. As an apparatus for generating plasma, a dry etching apparatus, a plasma CVD apparatus, a high-density plasma CVD apparatus, or the like can be used.

In addition, heat treatment may be performed after the element is added.

In accordance with an embodiment of the present invention, it is possible to provide a highly reliable semiconductor device by giving stable electric characteristics to a transistor of which an active layer is formed using an oxide semiconductor and the threshold voltage is difficult to control.

BRIEF DESCRIPTION OF THE DRAWINGS

FIG. 4 is a circuit diagram illustrating an example of a liquid crystal display device including a transistor according to an embodiment of the present invention.

DETAILED DESCRIPTION OF THE INVENTION

Figure 1A:
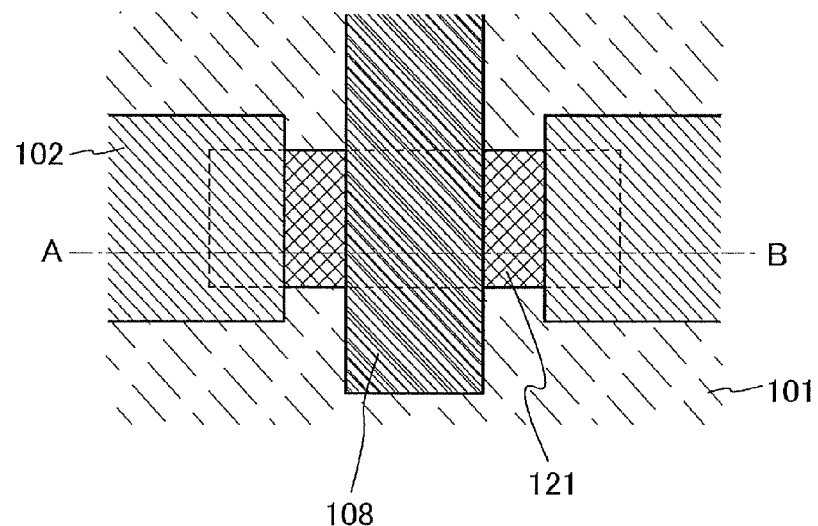
FIGS. 1A and 1B are a top view and a cross-sectional view illustrating an example of a semiconductor device according to an embodiment of the present invention.

Embodiments of the present invention will be described in detail with reference to the drawings. Note that the present invention is not limited to the description below, and it is easily understood by those skilled in the art that modes and details thereof can be changed in various ways without departing from the spirit and the scope of the present invention. Therefore, the present invention should not be construed as being limited to the description in the following embodiments. Note that the same portions or portions having similar functions in the structure of the present invention described below are denoted by the same reference numerals throughout the drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

In this embodiment, an example of a transistor which is a semiconductor device according to an embodiment of the present invention will be described with reference to FIGS. 1A and 1B, FIGS. 2A to 2C, and FIGS. 3A to 3C.

Figure 1B:
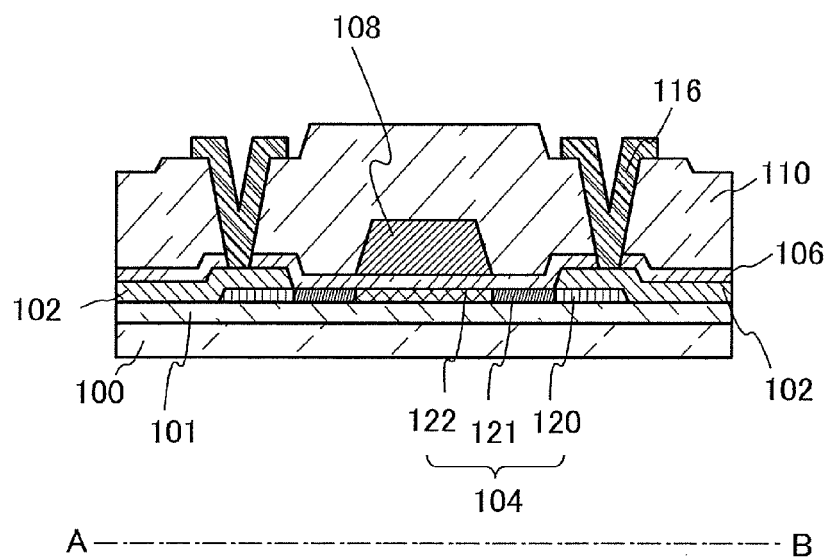

FIG. 1A is a top view of a transistor. FIG. 1B is a cross-sectional view along dashed and dotted line A-B in FIG. 1A. Note that in FIG. 1A, some components of the transistor (e.g., a gate insulating film 106 and an interlayer insulating film 110) are omitted for simplicity.

Here, cross section A-B in FIG. 1B will be described in detail.

The transistor illustrated in FIG. 1B includes an oxide semiconductor film 104 over an insulating surface which includes a pair of first regions 120, a pair of second regions 121, and a third region 122; a pair of electrodes 102 in contact with the oxide semiconductor film 104; a gate insulating film 106 over the oxide semiconductor film 104; a gate electrode 108 provided between the pair of electrodes 102 with the gate insulating film 106 interposed therebetween; an interlayer insulating film 110 covering the gate insulating film 106 and the gate electrode 108; and wirings 116 connected to the pair of electrodes 102 through contact holes provided in the interlayer insulating film 110. In this embodiment, the case where a base insulating film 101 is provided as the insulating surface over a substrate 100 is described.

The pair of first regions 120 overlap with the pair of electrodes 102, the third region 122 overlaps with the gate electrode 108, and the pair of second regions 121 are formed between the pair of first regions 120 and the third region 122. The pair of second regions 121 contain one or more elements selected from nitrogen, phosphorus, and arsenic and the third region 122 contains an element selected from nitrogen, phosphorus, and arsenic. The concentration of the element in the pair of second regions 121 is higher than that in the third region 122.

The sum of the concentrations of nitrogen, phosphorus, and arsenic in the pair of second regions is higher than or equal to $5 \times 10^{21}$ atoms/cm$^3$ and lower than $5 \times 10^{22}$ atoms/cm$^3$, and the sum of the concentrations of nitrogen, phosphorus, and arsenic in the third region is higher than or equal to $5 \times 10^{20}$ atoms/cm$^3$ and lower than $5 \times 10^{21}$ atoms/cm$^3$.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used as the substrate 100. Still alternatively, any of these substrates further provided with a semiconductor element may be used as the substrate 100.

A flexible substrate may alternatively be used as the substrate 100. In that case, a transistor may be formed directly over a flexible substrate. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 101 may be a single layer or a stack formed using one or more of a silicon oxide film, a silicon oxynitride film, a silicon nitride oxide film, a silicon nitride film, an aluminum oxide film, an aluminum nitride film, an aluminum oxynitride film, and a gallium oxide film. The base insulating film 101 does not need to be a film from which oxygen is released by heat treatment. This is because the electric resistance of the oxide semiconductor film can be increased by addition of ions in a later step for manufacturing a transistor, so that the electric resistance of the oxide semiconductor film does not need to be increased by compensating for oxygen deficiency in the oxide semiconductor film with oxygen released from the base insulating film 101.

In this specification, silicon oxynitride refers to a substance that contains more oxygen than nitrogen and for example, silicon oxynitride contains oxygen, nitrogen, silicon, and hydrogen at concentrations of higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide refers to a substance that contains more nitrogen than oxygen and for example, silicon nitride oxide contains oxygen, nitrogen, silicon, and hydrogen at concentrations of higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that percentages of oxygen, nitrogen, silicon, and hydrogen fall within the aforementioned ranges in the case where measurement is performed using Rutherford backscattering spectrometry (RBS) or hydrogen forward scattering (HFS). In addition, the total of the percentages of the constituent elements does not exceed 100 at. %.

The oxide semiconductor film 104 may be formed by a sputtering method, a plasma CVD method, a pulsed laser deposition (PLD) method, a molecular beam epitaxy (MBE) method, a coating method, a printing method, an evaporation method, or the like.

A sputtering apparatus used for forming the oxide semiconductor film by a sputtering method will be described in detail below.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of a gas from the outside of a vacuum system through a minute hole, a sealing defect, or the like. The internal leakage is due to leakage through a partition, such as a valve, in a vacuum system or due to a released gas from an internal member. Measures need to be taken from both aspects of the external leakage and the internal leakage in order that the leakage rate be lower than or equal to $1 \times 10^{-10}$ Pa·m$^3$/sec.

In order to decrease the external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can decrease the external leakage. Further, with the use of a metal material covered with iron fluoride, aluminum oxide, chromium oxide, or the like which is in the passive state, a released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing any of iron, chromium, nickel, and the like covered with the above-mentioned material may also be used. The alloy material containing any of iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the refiner and the treatment chamber is less than or equal to 5 m, preferably less than or equal to 1 m. When the length of the pipe is less than or equal to 5 m, preferably less than or equal to 1 m, the influence of the released gas from the pipe can be reduced accordingly.

Evacuation of the treatment chamber is preferably performed with, in appropriate combination, rough vacuum pumps such as a dry pump and high vacuum pumps such as a sputter ion pump, a turbo molecular pump, and a cryopump. The turbo molecular pump has an outstanding capability in removing a large-sized molecule, whereas it has a low capability in removing hydrogen or water. Hence, combination with a cryopump having a high capability in removing water or a sputter ion pump having a high capability in removing hydrogen is effective.

An adsorbate present at the inner wall of the treatment chamber does not influence the pressure in the treatment chamber because it is adsorbed onto the inner wall, but the adsorbate leads to release of a gas at the time of the evacuation of the treatment chamber. Therefore, although the leakage rate and the evacuation rate do not have a correlation, it is preferable that the adsorbate present in the treatment chamber be removed as much as possible and evacuation be performed in advance with the use of a pump having a high evacuation capability. Note that the treatment chamber may be subjected to baking for promotion of removal of the adsorbate. By the baking, the rate of removal of the adsorbate can be increased about tenfold. The baking should be performed at a temperature of higher than or equal to 100° C. and lower than or equal to 450° C. In this case, when the adsorbate is removed while an inert gas is introduced, the rate of removal of water or the like, which is difficult to remove only by evacuation, can be further increased.

In a sputtering method, an RF power supply device, an AC power supply device, a DC power supply device, or the like can be used as appropriate as a power supply device for generating plasma.

The oxide semiconductor film 104 contains at least one element selected from In, Ga, Sn, and Zn. Such an oxide semiconductor film can be formed using a target of, for example, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a one-component metal oxide such as a Zn—O-based metal oxide or a Sn—O-based metal oxide; or the like. In addition, any of the above oxide semiconductors may contain an element other than In, Ga, Sn, and Zn or a compound containing the element, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

In addition, as the oxide semiconductor, a thin film represented by the chemical formula, $InMO_3(ZnO)_m$ (m>0) can be used. Here, M represents one or more metal elements selected from Zn, Ga, Al, Mn, Co, Sn, Hf, Ti, and Zr. For example, M can be Ga, Ga and Al, Ga and Mn, Ga and Co, or the like.

In the case where an In—Ga—Zn—O-based material is used as the oxide semiconductor, an example of the target is a metal oxide target containing In, Ga, and Zn at a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Further alternatively, a target having a composition ratio where $In_2O_3:ZnO=25:1$ to $1:4$ [molar ratio] can be used.

In the case where an In—Zn—O-based material is used as the oxide semiconductor, a target therefor has a composition ratio where In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio where In:Zn:O=X:Y:Z, the relation of Z>1.5X+Y is satisfied.

As a sputtering gas, a rare gas (typically argon), an oxygen gas, or a mixed gas of a rare gas and an oxygen gas is used as appropriate. It is preferable that a high-purity gas from which impurities such as hydrogen, water, a hydroxyl group, and hydride are removed be used as a sputtering gas.

The oxide semiconductor film 104 is formed using a material whose band gap is greater than or equal to 2.5 eV, preferably greater than or equal to 3.0 eV in order to reduce the off-state current of the transistor. Note that a material having semiconductor characteristics whose band gap is within the above range which is not an oxide semiconductor may also be used.

In the oxide semiconductor film 104, hydrogen, an alkali metal, an alkaline earth metal, and the like are reduced and the concentration of impurities is very low. Therefore, in the transistor whose channel region is formed using the oxide semiconductor film, the off-state current can be reduced.

The concentration of hydrogen contained in the oxide semiconductor film is lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

An alkali metal is not an element contained in an oxide semiconductor, and therefore, is an impurity. Also, an alkaline earth metal is an impurity in the case where an alkaline earth metal is not contained in an oxide semiconductor. An alkali metal, in particular, sodium (Na) becomes Na$^+$ when an insulating film in contact with the oxide semiconductor film is an oxide and Na diffuses into the insulating film. In addition, in the oxide semiconductor film, Na cuts or enters a bond between a metal and oxygen which are contained in an oxide semiconductor. As a result, for example, deterioration in characteristics of the transistor such as a shift of the threshold voltage in the negative direction to lead to a normally-on transistor or a reduction in field-effect mobility occurs; in addition, variation in characteristics is also caused. Such deterioration in characteristics of the transistor and variation in characteristics due to the impurity frequently appear when the concentration of hydrogen in the oxide semiconductor film is sufficiently low. Therefore, when the concentration of hydrogen in the oxide semiconductor film is lower than or equal to $1\times10^{18}$ atoms/cm$^3$, preferably lower than or equal to $1\times10^{17}$ atoms/cm$^3$, the concentration of the above impurity is preferably reduced. Specifically, the measurement value of the concentration of Na is preferably lower than or equal to $5\times10^{16}$ atoms/cm$^3$, more preferably lower than or equal to $1\times10^{16}$ atoms/cm$^3$, still more preferably lower than or equal to $1\times10^{15}$ atoms/cm$^3$. In addition, the measurement value of the concentration of lithium (Li) is preferably lower than or equal to $5\times10^{15}$ atoms/cm$^3$, more preferably lower than or equal to $1\times10^{15}$ atoms/cm$^3$. In addition, the measurement value of the concentration of potassium (K) is preferably lower than or equal to $5\times10^{15}$ atoms/cm$^3$, more preferably lower than or equal to $1\times10^{15}$ atoms/cm$^3$.

By using the oxide semiconductor film 104 described above, the off-state current of the transistor can be reduced. Specifically, the off-state current per micrometer of the channel width of the transistor can be lower than or equal to $1\times10^{-18}$ A, lower than or equal to $1\times10^{-21}$ A, or lower than or equal to $1\times10^{-24}$ A.

The substrate temperature in forming the oxide semiconductor film is set to higher than or equal to 150° C. and lower than or equal to 450° C., preferably higher than or equal to 200° C. and lower than or equal to 350° C. When the oxide semiconductor film is formed while the substrate is heated to higher than or equal to 150° C. and lower than or equal to 450° C., preferably higher than or equal to 200° C. and lower than or equal to 350° C., moisture (including hydrogen) or the like is prevented from entering the film.

The oxide semiconductor film 104 is in a single crystal state, a polycrystalline (also referred to as polycrystal) state, an amorphous state, or the like.

The oxide semiconductor film 104 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to an a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electric characteristics of the transistor due to irradiation with visible light or ultraviolet light can be reduced. Thus, the transistor has high reliability.

The pair of electrodes 102 are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which a titanium film is formed over an aluminum film, a two-layer structure in which a titanium film is formed over a tungsten film, a two-layer structure in which a copper film is formed over a copper-magnesium-aluminum alloy film, and a three-layer structure in which a titanium film, an aluminum film, and a titanium film are stacked in that order are given. Further, a transparent conductive material containing indium oxide, tin oxide, or zinc oxide may be used. Note that the pair of electrodes 102 also function as wirings.

The gate insulating film 106 may be formed with a single layer or a stack using, for example, one or more of silicon oxide, silicon oxynitride, silicon nitride oxide, silicon nitride, aluminum oxide, hafnium oxide, gallium oxide, and the like. For example, the gate insulating film 106 may be formed by a thermal oxidation method, a CVD method, a sputtering method, or the like.

When the gate insulating film 106 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a stacked-layer structure can be used in which a high-k material and one or more of silicon oxide, silicon oxynitride, silicon nitride, silicon nitride oxide, aluminum oxide, aluminum oxynitride, and gallium oxide are stacked. The thickness of the gate insulating film 106 is preferably greater than or equal to 1 nm and less than or equal to 300 nm, more preferably greater than or equal to 5 nm and less than or equal to 50 nm.

The gate electrode 108 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. In addition, the gate electrode 108 can have a single-layer structure or a stacked-layer structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 108 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating film 106, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 108 and the gate insulating film 106. These films each have a work function of higher than or equal to 5 eV, preferably higher than or equal to 5.5 eV; thus, the threshold voltage in the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration of higher than at least the oxide semiconductor film 104, specifically, an In—Ga—Zn—O film having a nitrogen concentration of higher than or equal to 7 at. % is used.

The interlayer insulating film 110 may be formed with a single layer or a stack using one or more of silicon oxide, silicon oxynitride, silicon nitride oxide, silicon nitride, aluminum oxide, and aluminum nitride by a sputtering method, a CVD method, or the like. For example, the film may be formed by a plasma CVD method with the use of a mixture which includes a silane gas as a main material and a proper source gas selected from a nitrogen oxide gas, a nitrogen gas, a hydrogen gas, and a rare gas. The substrate temperature may be set to higher than or equal to 200° C. and lower than or equal to 550° C.

The wirings 116 may be formed using a material similar to that for the gate electrode 108.

In this embodiment, the structure in which the gate electrode does not overlap with the pair of electrodes is described, but the present invention is not limited thereto. For example, a transistor including an oxide semiconductor film which includes the pair of first regions and the third region can be formed. Further, without limitation to the top-gate transistor described in this embodiment, a bottom-gate transistor may be employed.

With the above structure, it is possible to provide a highly reliable semiconductor device by giving stable electric characteristics to a transistor of which an active layer is formed using an oxide semiconductor and the threshold voltage is difficult to control.

<Example of Method for Manufacturing Transistor>

Next, a method for manufacturing the transistor illustrated in FIGS. 1A and 1B will be described with reference to FIGS. 2A to 2C and FIGS. 3A to 3C.

First, the base insulating film 101 is formed over the substrate 100.

Next, the oxide semiconductor film 104 is formed over the base insulating film 101.

Figure 2A:
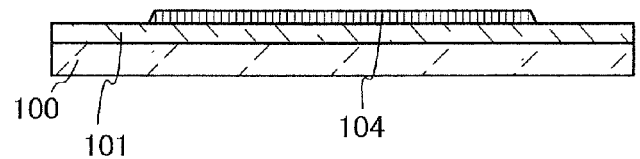
FIGS. 2A to 2C are cross-sectional views illustrating an example of a manufacturing process of a semiconductor device according to an embodiment of the present invention.

The oxide semiconductor film 104 is formed in such a manner that an oxide semiconductor film with a thickness of greater than or equal to 1 nm and less than or equal to 50 nm is formed by a sputtering method, a mask is formed over the oxide semiconductor film, and the oxide semiconductor film is selectively etched with the use of the mask (see FIG. 2A).

The mask used for the etching of the oxide semiconductor film can be formed as appropriate by a photolithography process, an inkjet method, a printing method, or the like. Wet etching or dry etching can be employed as appropriate for the etching of the oxide semiconductor film.

After the oxide semiconductor film is formed, the substrate 100 is preferably subjected to heat treatment to release moisture and hydrogen from the oxide semiconductor film. Through the heat treatment, a CAAC-OS film with higher crystallinity can be formed. Further, in the heat treatment, oxygen is removed from the oxide semiconductor film to some extent, so that oxygen deficiency is generated in the oxide semiconductor film and the electric resistance is reduced. Accordingly, contact resistance between the oxide semiconductor film and the pair of electrodes 102 which are formed later can be reduced, whereby the on-state current of the transistor can be improved.

The temperature for the heat treatment is preferably set such that moisture and hydrogen can be released from the oxide semiconductor film; the temperature is typically higher than or equal to 200° C. and lower than the strain point of the substrate 100, preferably higher than or equal to 250° C. and lower than or equal to 450° C.

A rapid thermal annealing (RTA) apparatus can be used for the heat treatment. With the use of the RTA apparatus, only in a short time, the heat treatment can be performed at a temperature of higher than or equal to the strain point of the substrate. Thus, the time required for formation of the CAAC-OS film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere, a reduced-pressure atmosphere, or in vacuum. The treatment time is 3 minutes to 24 hours. Heat treatment for longer than 24 hours is not preferable because the productivity is reduced.

Figure 2B:
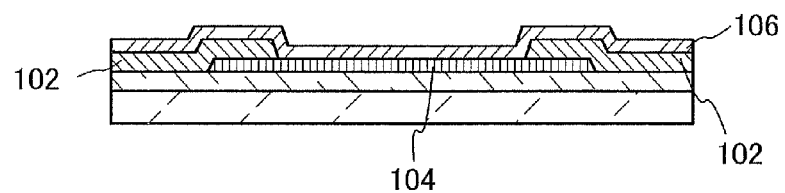

As illustrated in FIG. 2B, the pair of electrodes 102 and the gate insulating film 106 are formed over the oxide semiconductor film 104. The pair of electrodes 102 are formed in such a manner that a conductive film is formed, a mask is formed over the conductive film, and the conductive film is selectively etched with the use of the mask.

Then, ions 150 are added to the oxide semiconductor film 104 with the use of the pair of electrodes 102 as a mask.

Figure 2C:
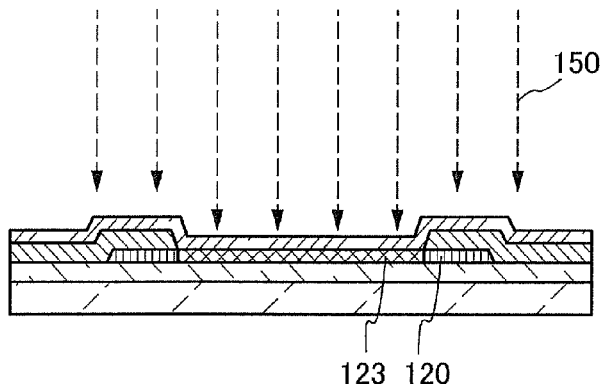

When the ions 150 are added to the oxide semiconductor film 104, the pair of electrodes 102 serve as a mask, whereby the pair of first regions 120 to which the ions 150 are not added and a region 123 to which the ions 150 are added are formed in a self-aligned manner (see FIG. 2C).

As a method for adding the ions 150 to the oxide semiconductor film 104, an ion doping method or an ion implantation method can be used. As the ions 150 to be added, ions of an element selected from nitrogen, phosphorus, and arsenic can be used. The concentration of the ions is higher than or equal to $5 \times 10^{20}$ atoms/cm$^3$ and lower than $5 \times 10^{21}$ atoms/cm$^3$.

By adding the ions 150 at the concentration in the above range to the oxide semiconductor film 104, the electric resistance of the region to which the ions 150 are added is increased. The ions are added in such a manner to increase the electric resistance of a portion to be a channel in the transistor, whereby the threshold voltage can be controlled.

Although the ions 150 are added to the oxide semiconductor film 104 while the insulating film (the gate insulating film 106 in this embodiment) or the like covers the oxide semiconductor film 104 in the above example, the ions 150 may be added while the oxide semiconductor film 104 is exposed.

Other than an ion doping method, an ion implantation method, or the like, the ions 150 can be added to the oxide semiconductor film 104 by a method in which ions are not implanted. For example, the ions can be added in the following manner: plasma is generated in an atmosphere of a gas containing an element to be added and plasma treatment is performed on an object to which the element is added. As an apparatus for generating plasma, a dry etching apparatus, a plasma CVD apparatus, a high-density plasma CVD apparatus, or the like can be used.

In addition, heat treatment may be performed after the ions 150 are added. The heat treatment is performed at a temperature of higher than or equal to 200° C. and lower than the strain point of the substrate 100, preferably higher than or equal to 450° C. and lower than or equal to 650° C.

Figure 3A:
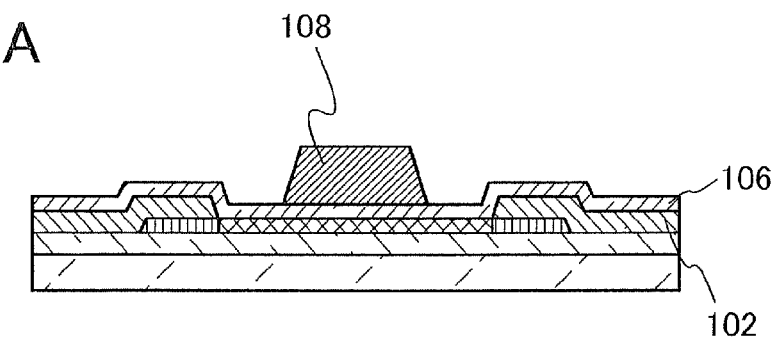
FIGS. 3A to 3C are cross-sectional views illustrating an example of a manufacturing process of a semiconductor device according to an embodiment of the present invention.

Then, as illustrated in FIG. 3A, the gate electrode 108 is formed over the gate insulating film 106. The gate electrode 108 is formed in such a manner that a conductive film is formed, a mask is formed over the conductive film, and the conductive film is selectively etched with the use of the mask. Note that the gate electrode 108 is formed so as not to overlap with the pair of electrodes 102.

Next, ions 160 are added to the region 123 to which the ions 150 are added in the oxide semiconductor film with the use of the gate electrode 108 and the pair of electrodes 102 as a mask.

Figure 3B:
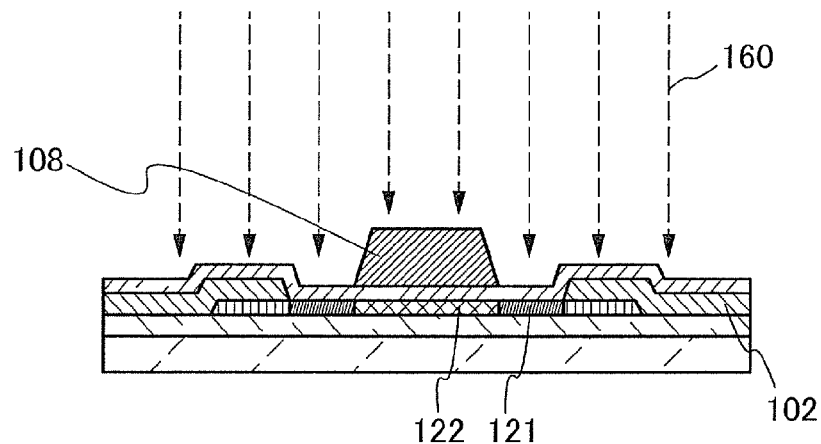

When the ions 160 are added to the region 123 to which the ions 150 are added in the oxide semiconductor film, the gate electrode 108 and the pair of electrodes 102 serve as a mask, whereby the third region 122 to which the ions 150 are added but the ions 160 are not added and the pair of second regions 121 to which the ions 150 and the ions 160 are added are formed in a self-aligned manner (see FIG. 3B).

As the ions 160 to be added, ions of an element selected from nitrogen, phosphorus, and arsenic can be used. The concentration of the ions 160 is set such that the sum of the concentration of the ions 150 and the concentration of the ions 160 is higher than or equal to $5 \times 10^{21}$ atoms/cm$^3$ and lower than $5 \times 10^{22}$ atoms/cm$^3$.

By adding the ions 160 at the concentration in the above range to the region 123 to which the ions 150 are added in the oxide semiconductor film, the pair of second regions 121 whose electric resistance is low and to which the ions 160 are added are formed. By adding the ions 160 in the above manner, the electric resistance of the oxide semiconductor film between the gate electrode 108 and the pair of electrodes 102 can be reduced, whereby the on-state current of the transistor can be increased.

In addition, heat treatment may be performed after the ions 160 are added. The heat treatment is performed at a temperature of higher than or equal to 200° C. and lower than the strain point of the substrate 100, preferably higher than or equal to 450° C. and lower than or equal to 650° C.

Figure 3C:
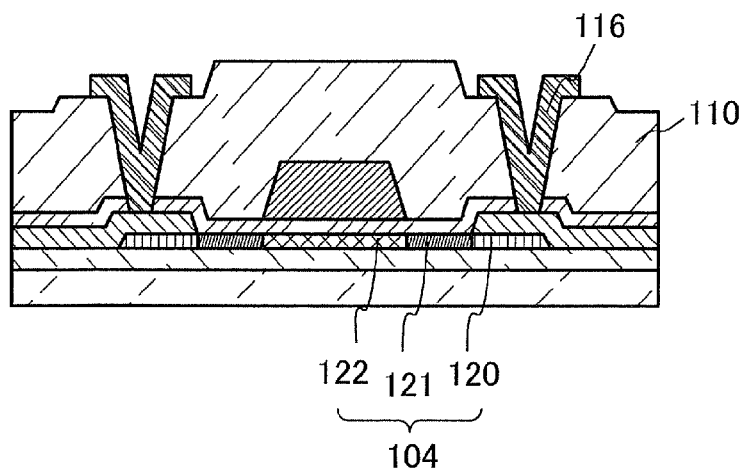

Then, as illustrated in FIG. 3C, the interlayer insulating film 110 is formed over the gate electrode 108 and the gate insulating film 106, the contact holes are provided in the interlayer insulating film 110, and the wirings 116 connected to the pair of electrodes 102 are formed.

Through the above process, it is possible to provide a highly reliable semiconductor device by giving stable electric characteristics to a transistor of which an active layer is formed using an oxide semiconductor and the threshold voltage is difficult to control.

Note that this embodiment can be combined with any of the other embodiments as appropriate.

(Embodiment 2)

In this embodiment, a liquid crystal display device manufactured using the transistor described in Embodiment 1 will be described. Note that an example in which an embodiment of the present invention is applied to a liquid crystal display device will be described in this embodiment; however, the present invention is not limited thereto. For example, application of an embodiment of the present invention to an electroluminescence (EL) display device is readily conceived by those skilled in the art.

FIG. 4 is a circuit diagram of an active matrix liquid crystal display device. The liquid crystal display device includes source lines SL_1 to SL_a, gate lines GL_1 to GL_b, and a plurality of pixels 200. The pixels 200 each include a transistor 230, a capacitor 220, and a liquid crystal element 210. The plurality of pixels 200 form a pixel portion of the liquid crystal display device. In the case where the source line or the gate line is simply mentioned, it may be denoted as the source line SL or the gate line GL.

The transistor described in Embodiment 1 is used as the transistor 230. With the use of the transistor which is an embodiment of the present invention, a display device with low power consumption, favorable electric characteristics, and high reliability can be obtained.

The gate line GL is connected to a gate of the transistor 230, the source line SL is connected to a source of the transistor 230, and a drain of the transistor 230 is connected to one of capacitor electrodes of the capacitor 220 and one of pixel electrodes of the liquid crystal element 210. The other of the capacitor electrodes of the capacitor 220 and the other of the pixel electrodes of the liquid crystal element 210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 1. Since the threshold voltage of the transistor is controlled, the off-state current can be decreased, and voltage for turning on the transistor can be low. Thus, power consumption can be reduced.

The source line SL is connected to a source driver circuit. The source driver circuit may include the transistor described in Embodiment 1. Since the threshold voltage of the transistor is controlled, the off-state current can be decreased, and voltage for turning on the transistor can be low. Thus, power consumption can be reduced.

One of or both the gate driver circuit and the source driver circuit may be formed over a substrate which is separately prepared and connected by a method such as a chip on glass (COG) method, a wire bonding method, or a tape automated bonding (TAB) method.

Since the transistor is easily broken by static electricity or the like, a protection circuit is preferably provided. The protection circuit is preferably formed using a nonlinear element.

On application of a potential that is higher than or equal to the threshold voltage of the transistor 230 to the gate line GL, electric charge supplied from the source line SL flows as a drain current of the transistor 230 and is accumulated in the capacitor 220. After charging for one row, the transistors 230 in the row are turned off and voltage application from the source line SL stops; however, a necessary voltage can be kept by the electric charge accumulated in the capacitors 220. Then, charging of the capacitors 220 in the next row starts. In this manner, charging for the first row to a b-th row is carried out.

Note that in the case where a transistor whose off-state current is small is used as the transistor 230, a time period during which the voltage is held can be longer. By this effect, the display rewriting frequency can be reduced in the case of displaying an image with little motion (including a still image); accordingly, a further reduction in power consumption is possible. Further, the capacitance of the capacitor 220 can be further reduced; accordingly, power consumed for charging can be reduced.

As described above, according to an embodiment of the present invention, a liquid crystal display device with high reliability and low power consumption can be obtained.

This embodiment can be implemented in appropriate combination with any of the other embodiments.

(Embodiment 3)

In this embodiment, an example of manufacturing a semiconductor memory device using the transistor described in Embodiment 1 will be described.

As typical examples of a volatile semiconductor memory device, there are a dynamic random access memory (DRAM) which stores data in such a manner that a transistor included in a memory element is selected and electric charge is accumulated in a capacitor, and a static random access memory (SRAM) which holds stored data using a circuit such as a flip-flop.

As typical examples of a nonvolatile semiconductor memory device, there is a flash memory which has a floating gate between a gate electrode and a channel region of a transistor and stores data by holding electric charge in the floating gate.

The transistor described in Embodiment 1 can be applied to some of transistors included in the above-described semiconductor memory device.

First, a DRAM to which the transistor described in Embodiment 1 is applied will be described with reference to FIGS. 5A and 5B.

Figure 5A:
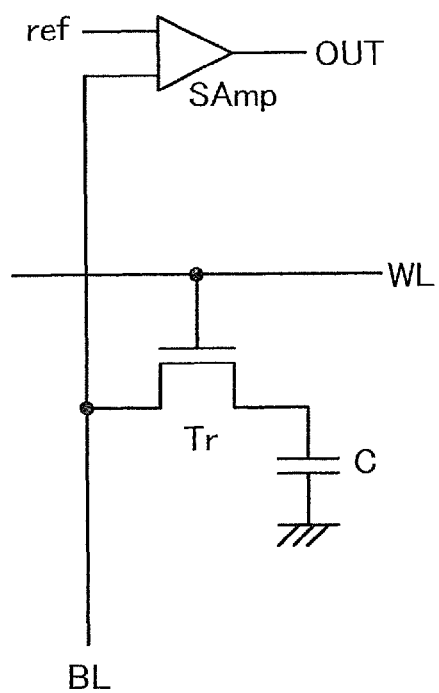
FIG. 5A is a circuit diagram illustrating an example of a semiconductor memory device including a transistor according to an embodiment of the present invention and FIG. 5B is a graph showing a relation between voltage (V) and time (T).

A DRAM includes a bit line BL, a word line WL, a sense amplifier SAmp, a transistor Tr, and a capacitor C (see FIG. 5A).

Figure 5B:
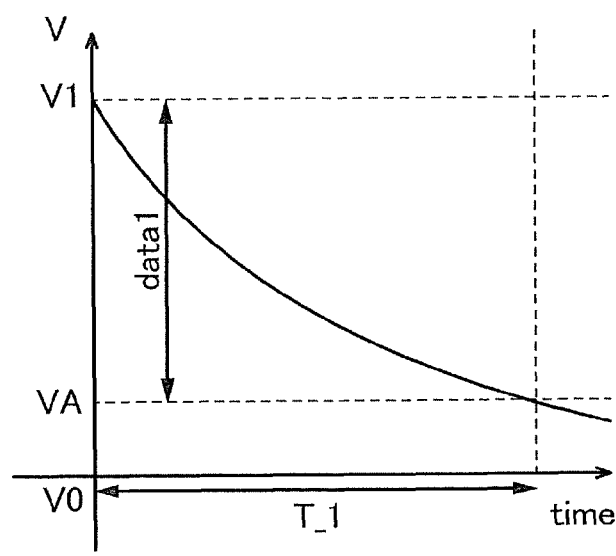

It is known that voltage held by the capacitor C is gradually reduced over time owing to the off-state current of the transistor Tr as shown in FIG. 5B. After a certain period of time, the voltage originally charged from V0 to V1 is decreased to VA which is a limit for reading out data 1. This period is called a holding period T_1. In the case of a two-level DRAM, refresh needs to be performed within the holding period T_1.

When the transistor described in Embodiment 1 is employed as the transistor Tr, the holding period T_1 can be made longer because the threshold voltage of the transistor is controlled and its off-state current is small. That is, the frequency of refresh operation can be reduced. Accordingly, power consumption can be reduced. For example, when a DRAM is formed using a transistor in which a highly purified oxide semiconductor film is included and the off-state current is less than or equal to $1 \times 10^{-21}$ A, preferably less than or equal to $1 \times 10^{-24}$ A, data can be held for several days to several decades without supply of power.

As described above, by using an embodiment of the present invention, a DRAM having high reliability and low power consumption can be provided.

Next, a nonvolatile memory to which the transistor described in Embodiment 1 is applied will be described with reference to FIGS. 6A and 6B.

Figure 6A:
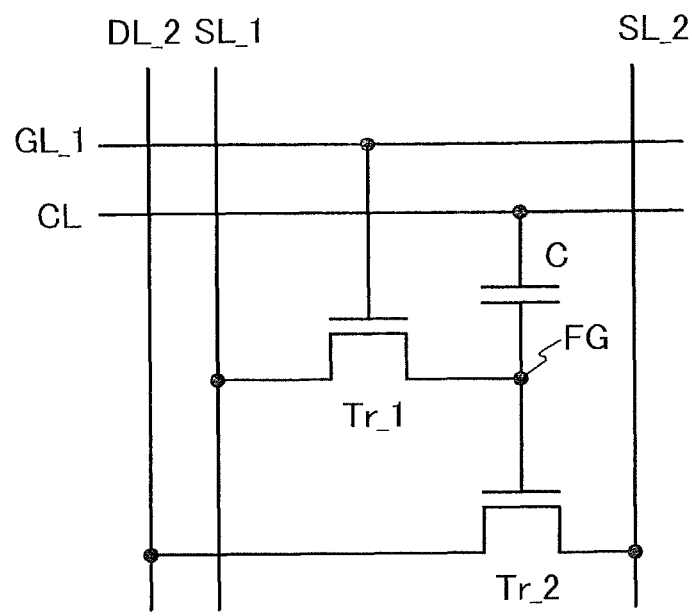
FIG. 6A is a circuit diagram illustrating an example of a semiconductor memory device including a transistor according to an embodiment of the present invention and FIG. 6B is a graph showing a relation between voltage (V) and current (I).
Figure 6B:
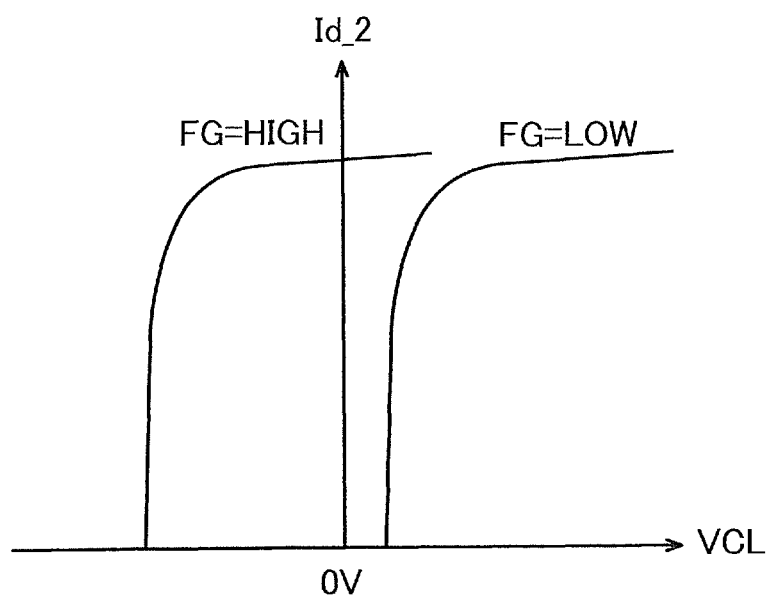

FIG. 6A is a circuit diagram of a NOR nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a floating gate FG connected to the other terminal of the capacitor C, a drain of the transistor Tr_1, and a gate of the transistor Tr_2.

The nonvolatile memory described in this embodiment utilizes variation in the threshold voltage of the transistor Tr_2, which depends on the voltage of the floating gate FG. For example, FIG. 6B is a graph showing a relation between the drain current Id_2 flowing through the transistor Tr_2 and the voltage $V_{CL}$ of the capacitor line CL.

The voltage of the floating gate FG can be controlled with the transistor Tr_1. For example, the voltage of the source line SL_1 is set to VDD. At this time, when the voltage of the gate line GL_1 is set to be higher than or equal to a voltage obtained by adding VDD to the threshold voltage Vth of the transistor Tr_1, the voltage of the floating gate FG can be HIGH. Further, when the voltage of the gate line GL_1 is set to be lower than or equal to the threshold voltage Vth of the transistor Tr_1, the voltage of the floating gate FG can be LOW.

Thus, either a $V_{CL}$-Id_2 curve (FG=LOW) or a $V_{CL}$-Id_2 curve (FG=HIGH) can be obtained. That is, when FG=LOW, Id_2 is small at a $V_{CL}$ of 0V; accordingly, data 0 is stored. Further, when FG=HIGH, Id_2 is large at a $V_{CL}$ of 0V; accordingly, data 1 is stored. In this manner, data can be stored.

Since the off-state current of the transistor described in Embodiment 1 can be made extremely small, if this transistor is used as the transistor Tr_1 here, unintentional leakage of electric charge accumulated in the floating gate FG through the transistor Tr_1 can be suppressed. Therefore, data can be held for a long period. By using an embodiment of the present invention, the threshold voltage of the transistor Tr_1 is controlled, which enables a reduction in the voltage necessary for writing. Thus, power consumption can be made low as compared to a flash memory or the like.

Note that the transistor described in Embodiment 1 may also be applied to the transistor Tr_2.

Next, a structure of the nonvolatile memory illustrated in FIG. 6A without the capacitor is described with reference to FIG. 7.

Figure 7:
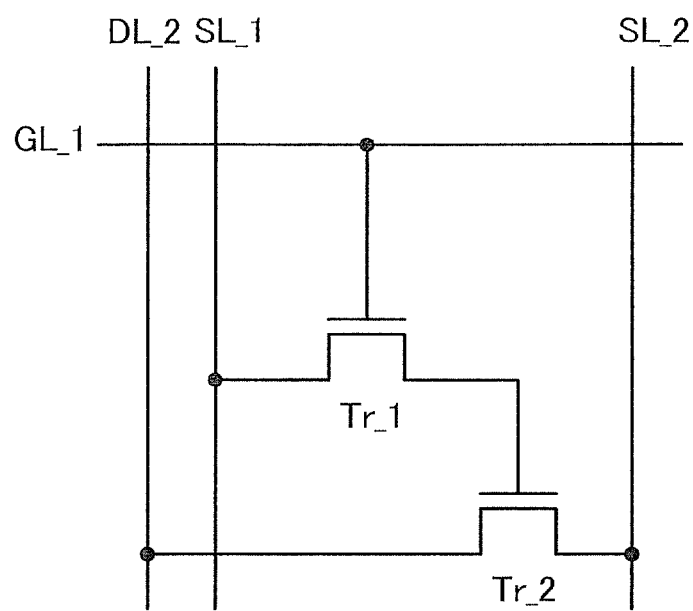
FIG. 7 is a circuit diagram illustrating an example of a semiconductor memory device including a transistor according to an embodiment of the present invention.

FIG. 7 is a circuit diagram of a NOR nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, and a drain line DL_2 connected to a drain of the transistor Tr_2. A gate of the transistor Tr_2 is connected to a drain of the transistor Tr_1.

In the case where a transistor whose off-state current is small is used as the transistor Tr_1, electric charge can be held between the drain of the transistor Tr_1 and the gate of the transistor Tr_2 even without the capacitor. The structure without the capacitor makes it possible to reduce the area of a memory, and the integration degree can be more increased than that of the structure with the capacitor.

Although the NOR nonvolatile memory including four or five wirings is described in this embodiment, a structure of the nonvolatile memory is not limited thereto. For example, a structure in which one wiring functions as the source line SL_1 and the drain line DL_2 may be employed. In addition, an embodiment of the present invention may be applied to a NAND nonvolatile memory.

As described above, according to an embodiment of the present invention, a semiconductor memory device with high reliability and low power consumption can be obtained.

This embodiment can be implemented in appropriate combination with any of the other embodiments.

(Embodiment 4)

A central processing unit (CPU) can be formed using a transistor of which an active layer is formed using an oxide semiconductor for at least part thereof.

Figure 8A:
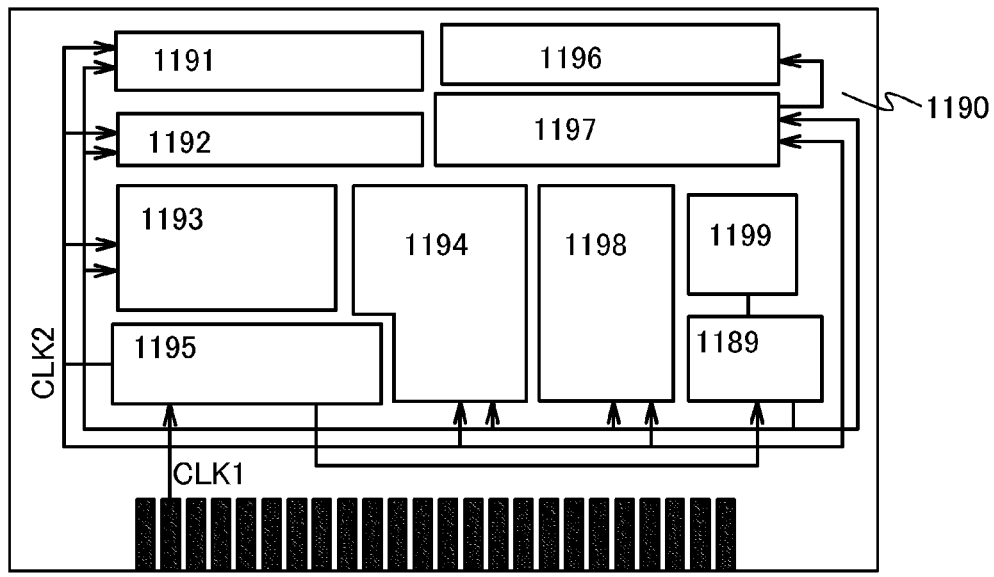
FIG. 8A is a block diagram illustrating a specific example of a CPU including a transistor according to an embodiment of the present invention and FIGS. 8B and 8C are circuit diagrams each illustrating part of the CPU.

FIG. 8A is a block diagram illustrating a specific structure of the CPU. The CPU illustrated in FIG. 8A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Needless to say, the CPU illustrated in FIG. 8A is just an example in which the structure is simplified, and an actual CPU has various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 8A, a memory element is provided in the register 1196. The memory element described in Embodiment 3 can be used as the memory element provided in the register 1196.

In the CPU illustrated in FIG. 8A, the register controller 1197 selects an operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten into the capacitor, and supply of power supply voltage to the memory element in the register 1196 can be stopped.

Figure 8B:
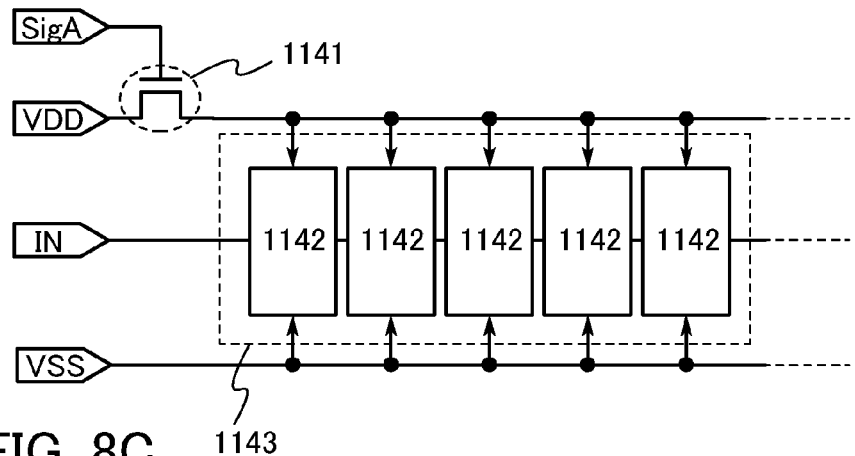
Figure 8C:
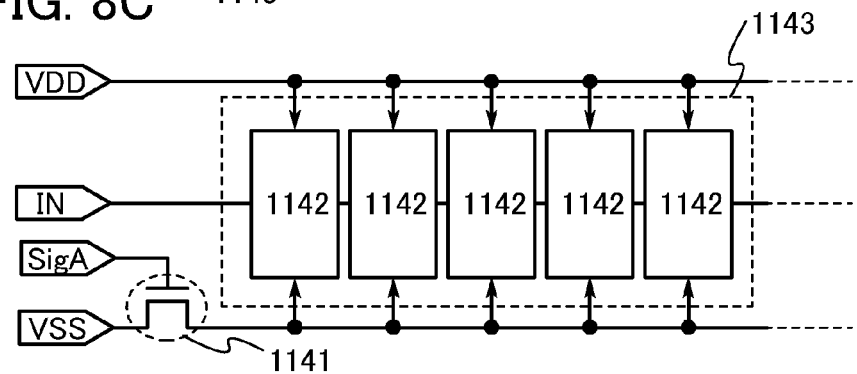

The power supply can be stopped by providing a switching element between a memory element group and a node to which a power supply potential VDD or a power supply potential VSS is supplied, as illustrated in FIG. 8B or FIG. 8C. Circuits illustrated in FIGS. 8B and 8C are described below.

FIGS. 8B and 8C each illustrate an example of a structure of a memory circuit including a transistor of which an active layer is formed using an oxide semiconductor as a switching element for controlling supply of a power supply potential to a memory element.

The memory device illustrated in FIG. 8B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with a high-level power supply potential VDD via the switching element 1141. Further, each of the memory elements 1142 included in the memory element group 1143 is supplied with a potential of a signal IN and a low-level power supply potential VSS.

In FIG. 8B, a transistor of which an active layer is formed using a semiconductor with a wide band gap such as an oxide semiconductor is used as the switching element 1141, and the switching of the transistor is controlled by a signal Sig A supplied to a gate electrode thereof.

Note that FIG. 8B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 8B, the switching element 1141 may control the supply of the low-level power supply potential VSS.

In FIG. 8C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where a switching element is provided between a memory element group and a node to which the power supply potential VDD or the power supply potential VSS is supplied, and an operation of a CPU is temporarily stopped and the supply of the power supply voltage is temporarily stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the above-described embodiments.

(Embodiment 5)

In this embodiment, examples of electric devices to which Embodiment 1 is applied will be described.

Figure 9A:
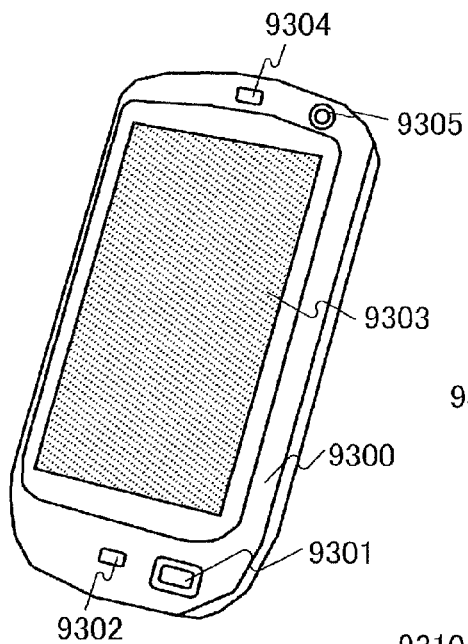
FIGS. 9A to 9C are perspective views each illustrating an example of an electronic device according to an embodiment of the present invention.

FIG. 9A illustrates a portable information terminal. The portable information terminal includes a housing 9300, a button 9301, a microphone 9302, a display portion 9303, a speaker 9304, and a camera 9305, and has a function as a mobile phone. An embodiment of the present invention can be applied to the display portion 9303 and the camera 9305. Although not illustrated, an embodiment of the present invention can also be applied to an arithmetic unit, a wireless circuit, or a memory circuit inside a main body.

Figure 9B:
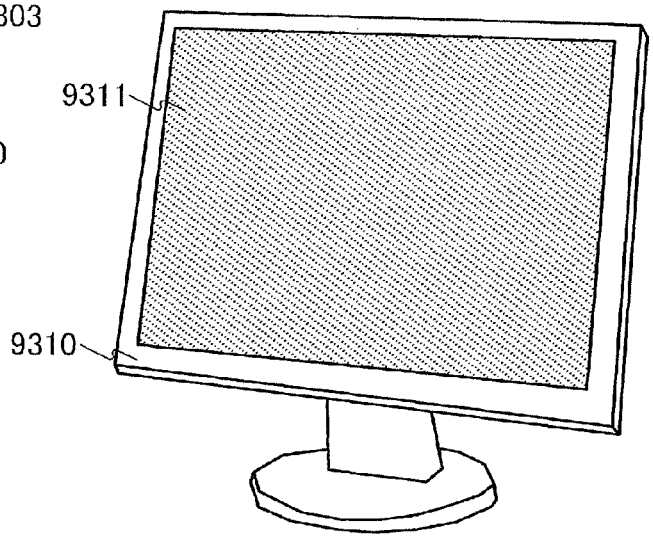

FIG. 9B illustrates a display. The display includes a housing 9310 and a display portion 9311. An embodiment of the present invention can be applied to the display portion 9311. When an embodiment of the present invention is employed, a display having high display quality can be provided even in the case where the size of the display portion 9311 is increased.

Figure 9C:
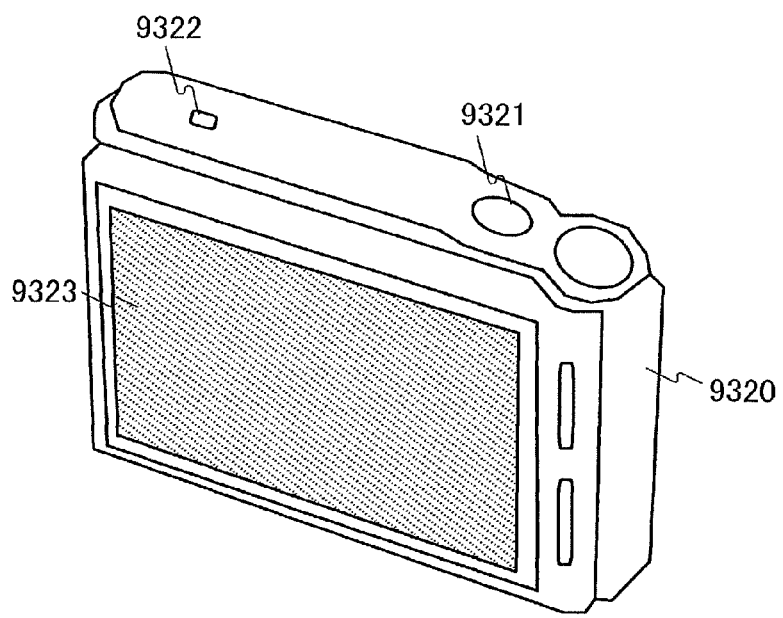

FIG. 9C illustrates a digital still camera. The digital still camera includes a housing 9320, a button 9321, a microphone 9322, and a display portion 9323. An embodiment of the present invention can be applied to the display portion 9323. Although not illustrated, an embodiment of the present invention can also be applied to a memory circuit or an image sensor.

This embodiment can be implemented in appropriate combination with any of the other embodiments.

EXAMPLE 1

In this example, a relation between the sheet resistance of an oxide semiconductor film and the amount of ions of nitrogen or phosphorus added to the oxide semiconductor film will be described.

A sample whose sheet resistance was evaluated was formed in the following manner. First, a silicon oxide film was formed with a thickness of 300 nm as a base insulating film over a glass substrate, and an oxide semiconductor film was formed thereover with a thickness of 30 nm by a sputtering method using an In—Ga—Zn—O (In:Ga:Zn=1:1:1 in atomic ratio) target. After that, heat treatment for dehydration and dehydrogenation was performed at 450° C. for 1 hour in a nitrogen atmosphere. In the heat treatment, oxygen was removed from the oxide semiconductor film, so that oxygen deficiency was generated. Consequently, the electric resistance of the oxide semiconductor film was reduced. Then, a silicon oxynitride film was formed by a plasma CVD method, ions of nitrogen or phosphorus were added to the oxide semiconductor film with the use of an ion implantation apparatus, a contact hole was formed in the silicon oxynitride film, and an electrode for applying voltage to the oxide semiconductor film was formed.

Figure 10A:
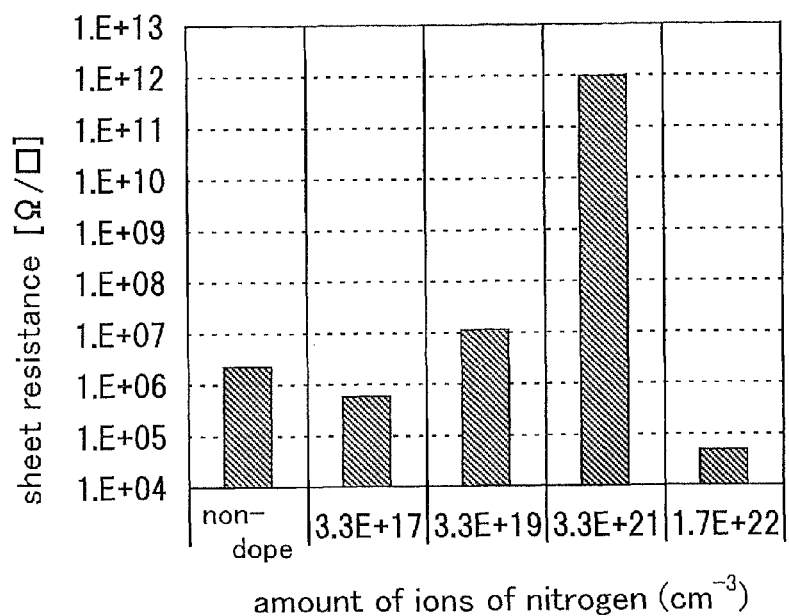
FIGS. 10A and 10B are graphs each showing the electric resistance of an oxide semiconductor film according to an embodiment of the present invention.

FIG. 10A shows a result of measuring, with the use of the sample manufactured as described above, the sheet resistance of the oxide semiconductor film which varies depending on the amount of ions of nitrogen which were added. As a result, it was found that the sheet resistance was greatly increased when the amount of ions of nitrogen was $3.3 \times 10^{21}$ atoms/cm$^3$ and the sheet resistance was greatly reduced when the amount of ions of nitrogen was $1.7 \times 10^{22}$ atoms/cm$^3$.

Figure 10B:
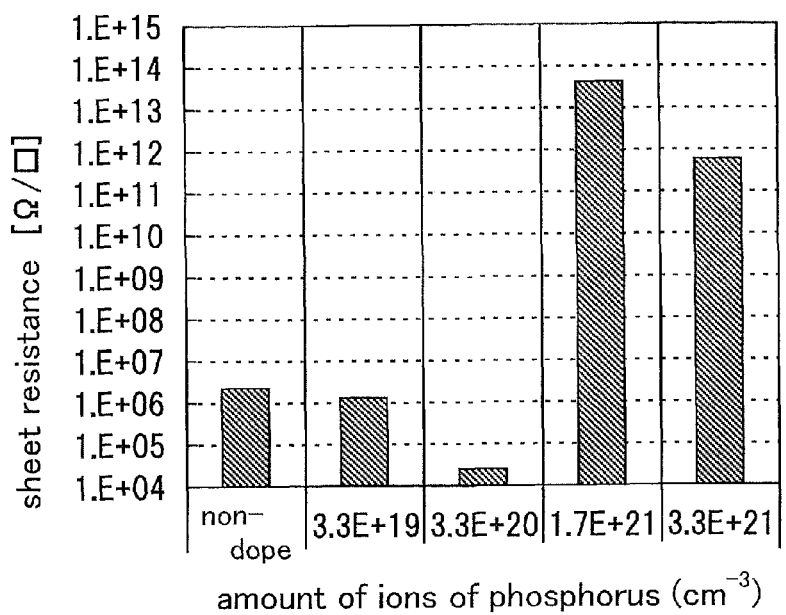

FIG. 10B shows a result of measuring, with the use of the sample manufactured as described above, the sheet resistance of the oxide semiconductor film which varies depending on the amount of ions of phosphorus which were added. As a result, it was found that the sheet resistance was greatly increased when the amount of ions of phosphorus was $1.7 \times 10^{21}$ atoms/cm$^3$ and the sheet resistance was reduced when the amount of ions of phosphorus was increased to $3.3 \times 10^{21}$ atoms/cm$^3$.

This application is based on Japanese Patent Application serial no. 2011-052905 filed with Japan Patent Office on Mar. 10, 2011, the entire contents of which are hereby incorporated by reference.

What is claimed is:

1. A method for manufacturing a semiconductor device, comprising the steps of:
    forming an oxide semiconductor film over an insulating surface;
    forming a pair of electrodes over the oxide semiconductor film;
    forming a gate insulating film covering the pair of electrodes and the oxide semiconductor film;
    adding first ions to the oxide semiconductor film through the gate insulating film using the pair of electrodes as a mask;
    forming a gate electrode overlapping with the oxide semiconductor film over the gate insulating film; and
    adding second ions to the oxide semiconductor film using the gate electrode as a mask;
    wherein the first ions and the second ions each comprise one of nitrogen, phosphorus, and arsenic.

2. The method for manufacturing a semiconductor device according to claim 1,
    wherein a concentration of the first ions in the oxide semiconductor film is higher than or equal to $5 \times 10^{20}$ atoms/cm$^3$ and lower than $5 \times 10^{21}$ atoms/cm$^3$, and
    wherein the sum of the concentration of the first ions and a concentration of the second ions in the oxide semiconductor film is higher than or equal to $5 \times 10^{21}$ atoms/cm$^3$ and lower than $5 \times 10^{22}$ atoms/cm$^3$.

3. The method for manufacturing a semiconductor device according to claim 1, wherein the oxide semiconductor film comprises two or more elements selected from the group consisting of In, Ga, Sn, and Zn.

4. The method for manufacturing a semiconductor device according to claim 1, wherein the oxide semiconductor film comprises In, Ga, and Zn.

5. The method for manufacturing a semiconductor device according to claim 1,
    wherein the oxide semiconductor film comprises a pair of first regions that do not include the first ions, a pair of second regions including the first ions and the second ions, and a third region including the first ions by the steps of adding the first ions and adding the second ions,
    wherein the pair of first regions are formed under the pair of electrodes,
    wherein the pair of second regions are formed between the pair of first regions and the third region, and
    wherein the third region is formed under the gate electrode.

6. The method for manufacturing a semiconductor device according to claim 5, wherein the pair of second regions and the third region comprise the same element selected from the group consisting of nitrogen, phosphorus, and arsenic.

7. The method for manufacturing a semiconductor device according to claim 1, wherein the oxide semiconductor film comprises a crystalline oxide semiconductor.

8. The method for manufacturing a semiconductor device according to claim 1, wherein the oxide semiconductor film comprises a crystalline oxide semiconductor with c-axis alignment.

9. A method for manufacturing a semiconductor device, comprising the steps of:
    forming an oxide semiconductor film over an insulating surface;
    forming a pair of electrodes over the oxide semiconductor film;
    forming a gate insulating film over the oxide semiconductor film;
    adding first ions to the oxide semiconductor film using the pair of electrodes as a mask;
    forming a gate electrode over the oxide semiconductor film with the gate insulating film therebetween; and
    adding second ions to the oxide semiconductor film using the gate electrode as a mask;
    wherein the first ions and the second ions each comprise one of nitrogen, phosphorus, and arsenic.

10. The method for manufacturing a semiconductor device according to claim 9,
wherein a concentration of the first ions in the oxide semiconductor film is higher than or equal to $5\times10^{20}$ atoms/cm$^3$ and lower than $5\times10^{21}$ atoms/cm$^3$, and
wherein the sum of the concentration of the first ions and a concentration of the second ions in the oxide semiconductor film is higher than or equal to $5\times10^{21}$ atoms/cm$^3$ and lower than $5\times10^{22}$ atoms/cm$^3$.

11. The method for manufacturing a semiconductor device according to claim 9, wherein the oxide semiconductor film comprises two or more elements selected from the group consisting of In, Ga, Sn, and Zn.

12. The method for manufacturing a semiconductor device according to claim 9, wherein the oxide semiconductor film comprises In, Ga, and Zn.

13. The method for manufacturing a semiconductor device according to claim 9,
wherein the oxide semiconductor film comprises a pair of first regions that do not include the first ions, a pair of second regions including the first ions and the second ions, and a third region including the first ions by the steps of adding the first ions and adding the second ions,
wherein the pair of first regions are formed under the pair of electrodes,
wherein the pair of second regions are formed between the pair of first regions and the third region, and
wherein the third region is formed under the gate electrode.

14. The method for manufacturing a semiconductor device according to claim 13, wherein the pair of second regions and the third region comprise the same element selected from the group consisting of nitrogen, phosphorus, and arsenic.

15. The method for manufacturing a semiconductor device according to claim 9, wherein the oxide semiconductor film comprises a crystalline oxide semiconductor.

16. The method for manufacturing a semiconductor device according to claim 9, wherein the oxide semiconductor film comprises a crystalline oxide semiconductor with c-axis alignment.

* * * * *